(12) United States Patent
Karabatsos

(10) Patent No.: US 8,040,683 B2
(45) Date of Patent: Oct. 18, 2011

(54) ACTIVE DUAL IN LINE MEMORY MODULE CONNECTOR WITH RE-DRIVEN PROPAGATED SIGNALS

(75) Inventor: Chris Karabatsos, Kingston, NY (US)

(73) Assignee: Urenschi Assets Limited Liability Company, Dover, DE (US)

( * ) Notice: Subject to any disclaimer, the term of this patent is extended or adjusted under 35 U.S.C. 154(b) by 11 days.

(21) Appl. No.: 12/425,107

(22) Filed: Apr. 16, 2009

(65) Prior Publication Data

US 2011/0143579 A1 Jun. 16, 2011

Related U.S. Application Data

(63) Continuation-in-part of application No. 11/831,062, filed on Jul. 31, 2007, now Pat. No. 7,539,024.

(60) Provisional application No. 60/834,844, filed on Aug. 2, 2006.

(51) Int. Cl.
*H01R 12/16* (2006.01)
(52) U.S. Cl. ...................................................... 361/785
(58) Field of Classification Search .................. 361/785; 439/189
See application file for complete search history.

(56) References Cited

U.S. PATENT DOCUMENTS

| | | | | |
|---|---|---|---|---|
| 6,493,250 | B2 * | 12/2002 | Halbert et al. | 365/63 |
| 7,009,848 | B2 * | 3/2006 | Ruckerbauer et al. | 361/785 |
| 7,200,023 | B2 * | 4/2007 | Foster, Sr. | 365/63 |
| 7,539,024 | B1 * | 5/2009 | Karabatsos | 361/785 |
| 2007/0236901 | A1 * | 10/2007 | Grundy et al. | 361/785 |
| 2008/0096433 | A1 | 4/2008 | Bixler et al. | |
| 2008/0207059 | A1 * | 8/2008 | Shan et al. | 439/637 |
| 2008/0316712 | A1 | 12/2008 | Pauley et al. | |

OTHER PUBLICATIONS

Notice of Allowance issued in U.S. Appl. No. 11/831,062 and mailed on Jan. 26, 2009.

* cited by examiner

*Primary Examiner* — Truc Nguyen

(57) ABSTRACT

An Active edge connector for memory modules has a base including two PCB sides and a spacer separating the sides, with driver chips mounted on each side of each side, printed wiring electrically connecting a first set of electrical signals from each of the driver chips to a mother board on which the connector is mounted, and printed wiring for electrically connecting a second set of electrical signals from each of the driver chips to a memory module inserted in the edge connector. When a group of connectors are mounted on a mother board, electrical signals arriving at the first connector are routed to its driver chips, producing re-driven signals to the next connector, and so on. A decoder circuit provides addressing signals determining the last such connector to which the signals are intended, and which prevents the signals from going to any connectors containing memories not addressed.

24 Claims, 10 Drawing Sheets

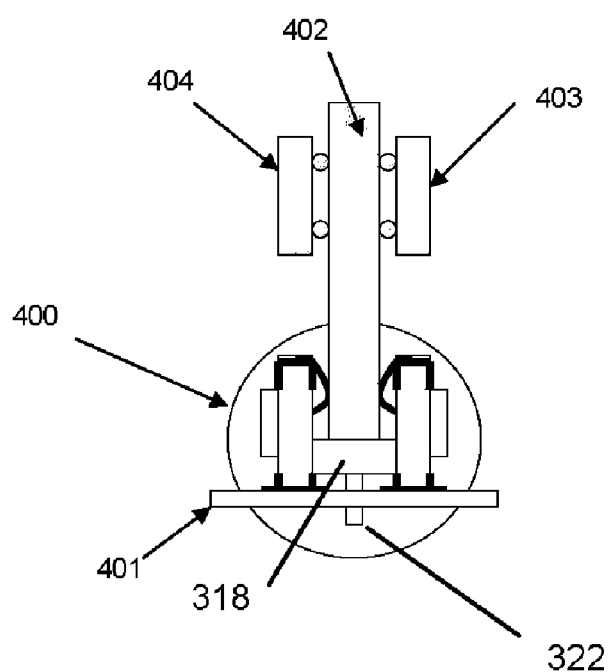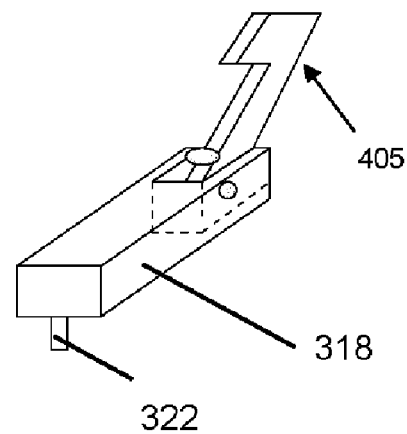
FIG. 4 A
FIG. 4 B

ACTIVE DUAL IN LINE MEMORY MODULE CONNECTOR WITH RE-DRIVEN PROPAGATED SIGNALS

This application claims priority based on U.S. patent application Ser. No. 11/831,062 filed on Jul. 31, 2007 for "Active Dual in Line Memory Module Connector with Re-driven Propagated Signals," as well as Provisional Patent 60/834,844 (Aug. 2, 2006), for "Active dual in line memory module connector (ADIMMC) with re-driven propagated signals".

FIELD OF THE INVENTION

This invention relates to the field of systems and methods for creating high capacity Dual In-Line Memory Module (DIMM) connectors with controlled impedance. Said connectors accommodate active circuits to meet requirements of high density memory module systems operating at high frequency data rates. Structures containing the proposed DIMM systems provide point to point connections in a series signal propagation arrangement.

DESCRIPTION RELATIVE TO THE PRIOR ART

Throughout the evolution of the computer memory systems, memory chips have either been used soldered on the motherboard or have been packaged in small PCB (printed circuit board) substrates with edge connector contacts and then plugged into connectors which are permanently soldered onto the motherboard.

Memories packaged in PCB substrates are known by different names such as SIMM (Single In line Memory Module) or DIMM (Dual In line Memory Module). To accommodate those modules, connectors have been designed and used on motherboards throughout the industry. None of those prior art connectors used in the industry have ever accommodated active circuits as an integral part of the physical structure.

The present invention will be better understood by describing the physical structure of the prior-art DIMM connector and then contrasting to the one proposed in the present invention.

Referring to FIG. 1A and FIG. 1B, the presently used DIMM connector, shown in cross sectional view, consists of a three dimensional plastic assembly 100 of long rectangular shape forming a cavity with partitioned compartments. A plethora of pins 101 in an array formation, properly formed, populates each side of the cavity in two parallel rows. The pins on one end are formed to make contact with and exert pressure on the tabs 102 of the edge connector of the DIMM 103 bearing memory chips 104. Those formed pin ends protrude within the walls of the cavity. The other end of each pin 101 is protruding through the plastic 100 and extends beyond to provide a soldering point to the motherboard 105. Such said extension is either a straight pin 101 to solder into a plated hole or is formed 106 to solder attach onto the surface of motherboard 105. Said formed pins are farther away from ground or VCC pins and as such present an impedance alteration and discontinuity which causes reflections of the signals.

Referring to FIG. 2, a prior-art memory sub-system consists of a controller 200 supporting, on one end, the interface of a CPU 207 and on the other end the interface to multiple memory DIMM modules 203 having DRAM devices 204 that are plugged into connectors 202. A DQ (data bit line) from each connector pin is attached to the same motherboard DQ line 201 line by a short wire 206 called a stub. The DQ line 201 could have a termination network 205. The capacitive load from each DRAM chip of each DIMM is cumulative on the DQ line 201. The higher the capacitive load the slower the signal becomes on that line. Therefore, the data rate of the signal is inversely proportional to the capacitive load of the line. In addition, reflection from each DIMM load degrades the quality of the signal.

The objective of all methods known and implemented is to include as many as possible memory chips in whatever packaged form so that the total arrangement results in a DIMM module with high memory capacity. However, such an arrangement of DIMMs and memory chips slows down the data rate.

The number of connectors on a motherboard of prior-art systems is constantly shrinking for space availability, frequency requirements, heat considerations and costs.

Presently, two connectors, and in some cases only one, is the norm depending on the data rate of the memory devices and of the interface.

However, the ever increasing demand for more memory capacity requires techniques to allow more memory capacity in restricted numbers of connectors with ability to provide heat dissipation. Cost reduction is a further consideration in the design of the memory sub-system.

In order to achieve high memory capacity and increase the data rate, a reduction of capacitive load is necessary. The best result is achieved only if a single load is presented to the driver of each data bit line in the direction of transmission.

The prior-art architecture of multiple drop-off connections as shown in FIG. 2 is not the solution. An architecture is needed where each data bit from point to point has a driver and a receiver, called point-to point-connection, with minimum capacitive load from point to point and a repeater driver and receiver for the same data bit for the next DIMM module down the line of the memory sub-system. Repeaters are used in many designs in order to accomplish point-to-point connections.

However, in the memory sub-system of prior art designs such solution has been impractical and requires more space on the motherboard, thus increasing the cost and complexity of the system. Another inhibiting factor is the long propagation delay due to the lengths of the repeater transmission lines in a multi-DIMM system on the motherboard. Yet another factor is the presence of long connecting stubs that create signal reflections, thus further distorting the quality of the signal. Bad signal quality results in receiver data bit errors.

The present invention of active connectors provides solutions to the above mentioned deficiencies of present designs.

SUMMARY OF THE INVENTION

It is the object of the present invention to provide an active connector which facilitates high density memory module systems operating at high frequency data rates.

In accordance with a first aspect of the invention, a connector is constructed having active circuits as part of the physical structure of the connector.

In accordance with a second aspect of the invention, the connector consists of two rigid double faced PCB, single or multiple layers, having long and short edges on the perimeter separated by material of thickness sufficient to form a cavity between the two PCBs, and to maintain alignment and rigidity of the PCB sides.

In accordance with a third aspect of the invention, each PCB bears active circuits in a packaged or Chip On Board (COB) arrangement, printed connecting wires on one or multiple layers for interconnections, connecting tabs on the surfaces for surface mounted active circuits with inputs connecting to input pins of the connector and multiple outputs connecting to connector output pins, connecting tabs or vias on the long perimeter sides for attaching pins. Each PCB bears said connecting tabs or vias on one long perimeter edge and on one or both faces for attaching surface mounting pins for motherboard connections. Furthermore, said other connecting tabs or vias are on the other long perimeter edge side for attaching springy pins to mate with the edge connector tabs of the DIMM PCB.

In accordance with a fourth aspect of the invention, the rectangular PCB pieces are attached to material which serves to keep the two PCB pieces in a parallel arrangement, thus creating a physical cavity for DIMM acceptance. This arrangement provides support and attachment of two latching mechanisms, one on each end in line with the cavity, for securing the inserted DIMM in position and for assisting in the extraction of the DIMM from the cavity. It further provides guiding pins for alignment of the connector on the proper position on the motherboard at time of solder reflow.

In accordance with a fifth aspect of the invention, the pins on the side of the connector that attaches to the motherboard are of "U" shape with a perpendicular extension at the bottom of the "U". The sides of the "U" are secured onto the PCB edge tabs and the perpendicular extension solders onto the motherboard PCB. The pins on the side that connects to the DIMM edge connector tabs are of "U" shape with a bent upward extension to provide a springy connecting pin to pressure against the edge tabs of the DIMM PCB.

In accordance with a sixth aspect of the invention, the connector attaches to the motherboard PCB with actual printed tabs on the face of the connector PCB and extending to the edge. Said tabs are soldered on the tabs of the motherboard with solder at the time of reflow.

In accordance with a seventh aspect of the invention, the connector is constructed with flexible material and with solid non-conductive substrate. The non-conductive substrate, either plastic or metal, with sides and cavity and guide pins, constitute a connector. The Flex PCB material with Signal, Ground and VCC planes is designed to accept the active circuits with all the interconnecting printed wires for the active circuits and the input/output connector pins. The connector pins that attach to the motherboard tabs are tabs formed on the Flex PCB or pins attached to the said Flex PCB tabs. The pins that connect to the DIMM edge connector are secured onto the Flex PCB tabs at the entry of the cavity of the rigid substrate. The Flex PCB substrate wraps around the bottom and sides of the rigid substrate and is adhered to the substrate with adhesive substance. The attachment of the connector to the motherboard is made by means of reflowing solder on the motherboard tabs, and on the corresponding tabs or pins of the Flex PCB connector that constitute the input/output pins.

In accordance with an eighth aspect of the invention, the Flex PCB layer with the active circuits are in two pieces, each attaching to the sides of the preformed connector. The input/output pins of the connector are attached to the solid non-conductive body of the connector and to the corresponding tabs that appear on the respective positions on the Flex PCB layers.

In accordance with a ninth aspect of the invention, the active circuits which re-drive the input/output signals on the active connector include the functions of receiving a signal from the connector pin to the motherboard and providing re-driven outputs. One output feeds the output pin of the connector that attaches to the corresponding DIMM edge connector tab and the other output of the same signal feeds the pin of the connector that serves as the propagation path to the next connector on the motherboard. All of the data signal paths through the active circuits are bi-directional. The address and control signal paths are unidirectional from the controller to all the DIMM connections.

In accordance with a tenth aspect of the invention the control of the direction of the data from connector to connector is performed at the time that the Write/Read is interpreted from command signals, and the appropriate control signals are passed to the active circuits on each connector of the system. The control signals are either sent to the connector system from the controller or are interpreted from the commands and address and controls that are re-driven on each active connector of the invention. The active circuits that are not required in the non-selected connectors are turned off.

In accordance with an eleventh aspect of the invention an inactive High Speed Connector is manufactured with flexible material with the active circuits absent so that the connections from the motherboard tabs to the pins that engage the DIMM tabs are printed wires with controlled impedance referenced to the Ground or VCC plane which is part of the Flex PCB substrate.

BRIEF DESCRIPTION OF THE DRAWINGS

These, and further features of the invention, may be better understood with reference to the accompanying specification and drawings depicting the preferred embodiments, in which:

FIG. 4A depicts a front elevation view of the connector of the present invention with the DIMM board inserted, and further showing the driver chips attached to the connector sides.

FIG. 4B is a perspective view which depicts the latching mechanism affixed to the spacer block of the connector.

DESCRIPTION OF THE PREFERRED EMBODIMENTS

The invention is better explained by reference to the drawings described above, and to the detailed descriptions and explanations which follow.

DEFINITIONS

The term "PCB" will be used to describe printed circuit board assemblies, which contain conducting materials including wiring leads, pads, and other features affixed to the surface, usually by a process of etching. Unless otherwise specified, PCBs are assumed to be rigid.

The term "Flex PCB" will be used to describe printed circuit board assemblies which are flexible.

The term "re-driver chip" will be used to describe the integrated circuit chip, located on the connector of the present invention or in close proximity to it, which contains both receivers and drivers that process data signals of the memory modules, in addition to other circuitry to support these functions. The re-driver chip in an alternative embodiment may also contain circuits that perform addressing and command and control functions.

The term "addressing chip" will be used to describe integrated circuit chips which perform addressing and command and control functions for the memory modules.

Operation of the Circuits

Referring first to FIGS. 3A through 3E, it may be seen that two long rectangular PCB members 300 and 301, each having two long and two short perimeter edges, a front face and a back face, are arranged and structured to make up the active connector. The dimensions of the PCB are such that the connector arrangement has a very low profile in height and width.

Figure 1:
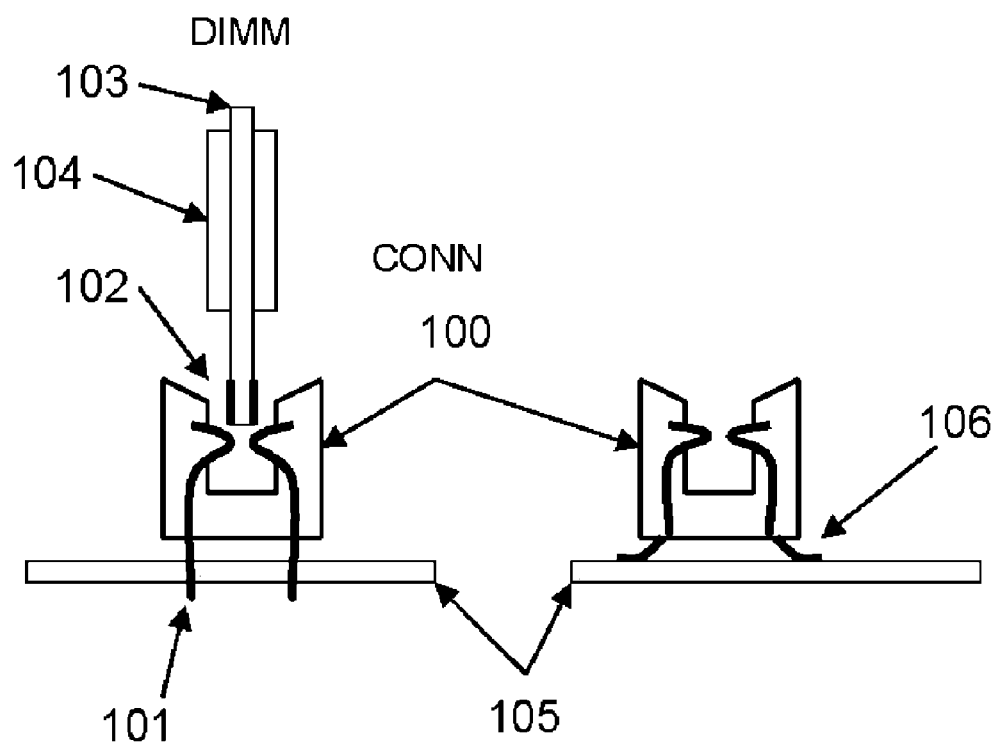
FIG. 1A depicts a typical prior art DIMM connector construction without any active circuits.
FIG. 1B depicts an alternative prior-art DIMM connector construction without any active circuits.
Figure 2:
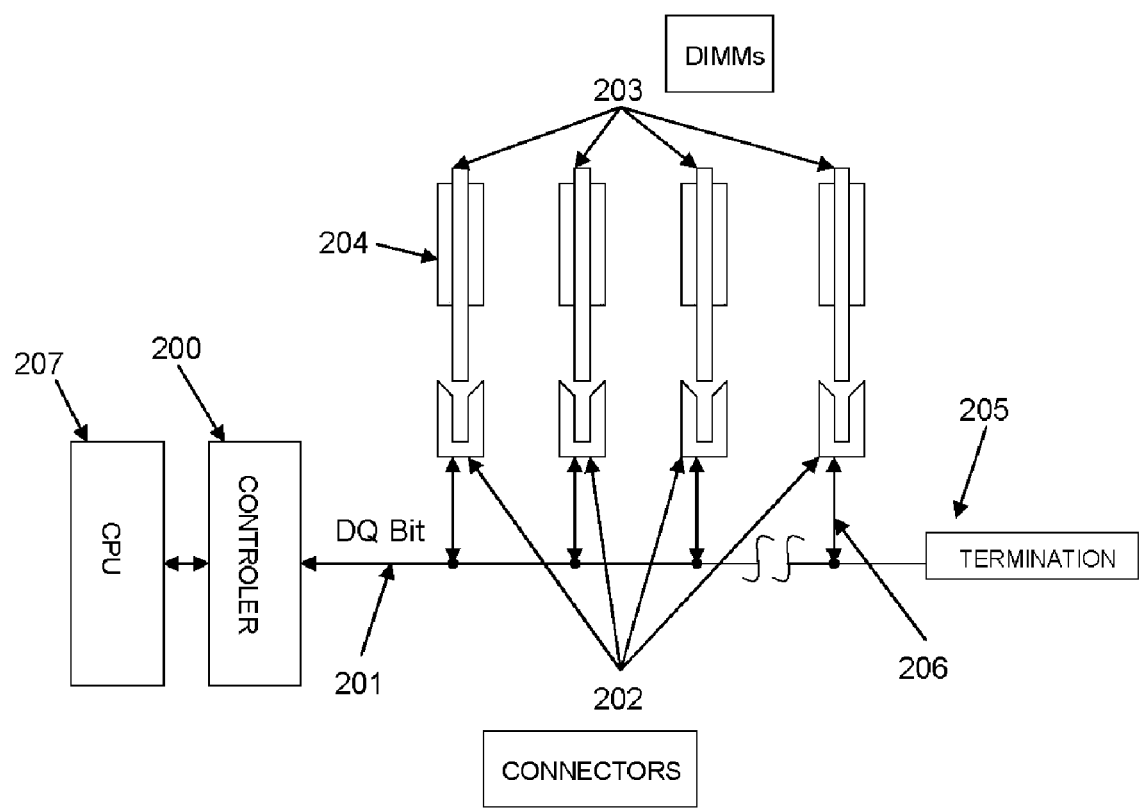
FIG. 2 depicts a typical prior art memory system interface with drop off connection arrangement of the DIMM connectors.
Figure 3:
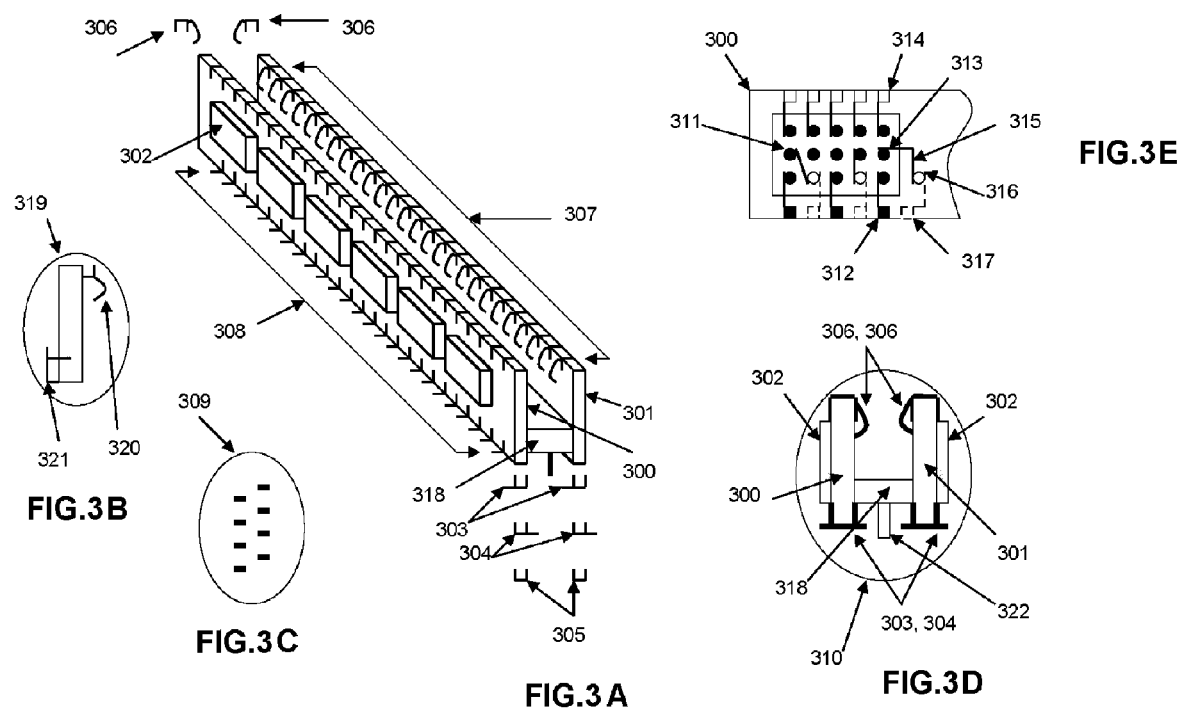
FIG. 3A depicts an active connector of the present invention with active circuits as part of the connector body.
FIG. 3B depicts a front elevation view of one side of the connector.
FIG. 3C shows a layout of the tabs on the connector sides, beneath one of driver chips.
FIG. 3D depicts a front elevation view of the connector.
FIG. 3E depicts a layout of the pads beneath one of the driver chips.

Still referring to FIGS. 3A and 3E, the front face of PCB 300, on which the driver chips 302 are mounted, contains etched wires and pads to facilitate the operation of the driver chips. One such area is shown in this figure, representing a typical configuration of wire and pads, corresponding to a single chip. In this figure the connections on the front face of the PCB are shown in bold, while those routed to the back face of the PCB are shown in phantom, having dotted lines instead of solid lines.

Along the lower perimeter edge of the front face of PCB 300, tabs 312 are etched in specified spacing. Along the same lower perimeter edge, at the back face of PCB 300, tabs 317 are etched. In a similar manner, tabs 314 are etched on the upper perimeter edge of PCB 300, on the back face. Pins 303 are attached onto tabs 312 of PCB 300, while pins 304 are attached onto tabs 317 of PCB 300.

In another arrangement, pins 305 are attached for both front and back face tabs of PCB 300.

The etched lines of PCB 301 are disposed in a similar way.

In order to maximize space utilization the pins on the bottom of the connectors are offset, as shown in the group 309 of FIG. 3C. Pins in the same column of this figure are exclusively from the front surface, or side, of a PCB, while those in the other column are from the other surface of the same PCB. Thus, referring again to FIG. 3E, the bold tabs at the bottom of the figure, typified by 312, are all attached to a pin belonging to one column of pins in FIG. 3C, while those shown in phantom, typified by 317, are all attached to a pin belonging to the other column.

Still referring to FIG. 3E, a plurality of footprint pads 311 are etched on the front face of PCB 300, to accept pins or solder balls of the active circuit chips. Tabs 312 which are connected to pins 303 connect to corresponding pads of the motherboard. Thus, pins 303 for PCB 300 carry input signals from motherboard to the active circuits and output signals from active circuits to the motherboard.

Referring again to FIG. 3E it may be seen that tabs 314 are etched on the back face of PCB 300. The tabs on the upper edge of PCB 300 connect to pins 306 on PCB 300, while those on the upper edge of PCB 301 connect to pins 306 on PCB 301. These pins make contact with the corresponding tabs on the DIMMS or other memory boards which insert into the connectors.

Some of the pads of the active circuit package, typified by 313 in FIG. 3E, are connected with etched wires 315 and via pads 316 to predefined tabs 317 which are etched on the back face of the long perimeter edge of PCB 300.

Still referring to FIG. 3E, it is noted that in the path where the direction of the signal is from the motherboard to the active circuit, the signal enters through tab 312 to the active circuit. The active circuit provides two output signals, which are copies of the input, one on tab 314 and one on pad 317.

As just noted, the output on tab 314 is sent to the DIMM that is attached to the connector through pins 306. The other output copy on tab 317 is sent back to the motherboard and is propagated to the next active connector attached to the motherboard. The process is repeated for every active connector in the memory subsystem.

For PCB 301 the active circuit pads are etched on the back face and the connections from front face edge pads to the active circuits on the back face is done through a via connection and printed wire.

In another embodiment of the invention, the active circuit pads are located in either face of the PCB when it becomes easier and convenient. There is no restriction on the actual locations and routings of the pads and via connections, except in accordance with the objectives of maximizing density and minimizing signal interference and degradation.

Still referring to FIGS. 3A through 3E each PCB, 300 and 301, will have a plurality of tabs 312 and 317 with pins 303 and 304 or with pins 305 or with pins 321 or any other shape of pins chosen and attached along one long perimeter edge of the PCB shown as row 308, which connects to the motherboard.

When the PCBs have the configuration shown in FIG. 3E, the plane of the PCBs are at right angles to the plane of the motherboard to which the connector is affixed. Thus, the tabs 312 will be at right angles to the corresponding tabs on the motherboard. Since the thickness of the tabs 312 is typically of the order of several mils, before soldering there will be a very small area of contact between these tabs and the corresponding tabs on the motherboard. However, after flow soldering, the solder will provide a substantial area of contact between the said tabs.

The other long perimeter edge of the PCB 300 and 301 will have a plurality of tabs 314 and pins 306, or with pins 320 or any other shape of pins chosen and attached along the said long perimeter edge of the PCB shown as row 307 that connect to the inserted DIMM edge connector tabs.

Referring next to FIG. 3D a front elevation view 310 of the assembled connector is also shown. The PCBs 300, 301 are shown separated by the separator 316. The driver chips 302 are seen attached to the outside surfaces of the PCBs, while the spring clips 306 which mate with the DIMM board (not shown) appear. Pins of the type 303 or 304 are shown at the bottom of the PCBs, and these are used for attachment to the mother board.

Referring next to FIG. 4A, it is seen that the two assembled PCBs with the active and inactive components and the appropriate pins, are assembled together around a spacer block 318 of rigid material either of PCB nature or metal, such as aluminum, or any other substance that has enough rigidity to keep the PCB in a parallel configuration. The rigid spacer block 318 has a protruding bottom member 322 for alignment to the footprint of the motherboard during the reflow process. A shroud or molded material can be included during reflow soldering to protect components and pins where necessary.

When the spacer block 318 is made of a heat conducting material, such as copper, further heat dissipation may be achieved by the use of a plate of heat conducting metal on the back of each of the PCBs which make up the sides of the connector. The optimum location for the plate is within the PCB substrate, wherein no electrically conducting signals are present, so that the plate does not interfere with the electrical conductivity of the circuitry on the outsides of the PCBs.

Figure 10:
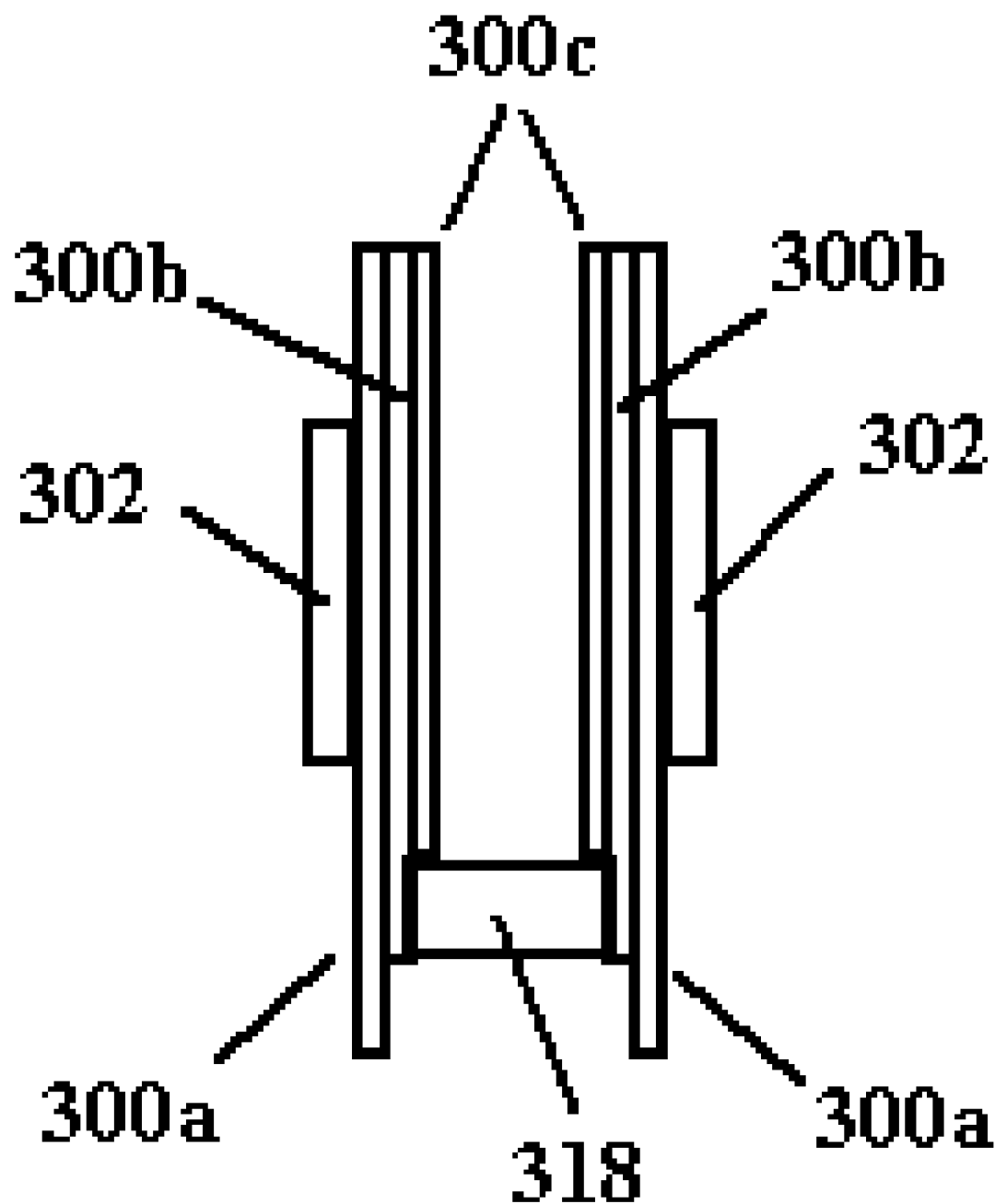
FIG. 10 depicts a cross section of the connector using a layer of copper clad material between two layers of substrate, and affixed to a metallic spacer.

Referring to FIG. 10, it is seen that the non-conductive outer layer 300*a* of the PCB contains the circuit elements 302 as in FIG. 3A, and the middle layer 300*b* is a copper-clad layer which is intimately affixed to the metal spacer block 318. A further non-conductive layer 300*c* on the inside of the PCB provides further insulation of the inside of the connector.

The structure of FIG. 10 provides a heat path for the dissipation of any heat generated by the electronic circuitry. The metal spacer block 318 may have fins formed at the ends to provide further heat dissipation if required.

Referring next to FIG. 4B a sample of latch mechanism 405 that may be included in each end of the rigid block is also shown. This latch mechanism holds the DIMM board securely in place once it has been inserted into the connector.

Figure 5:
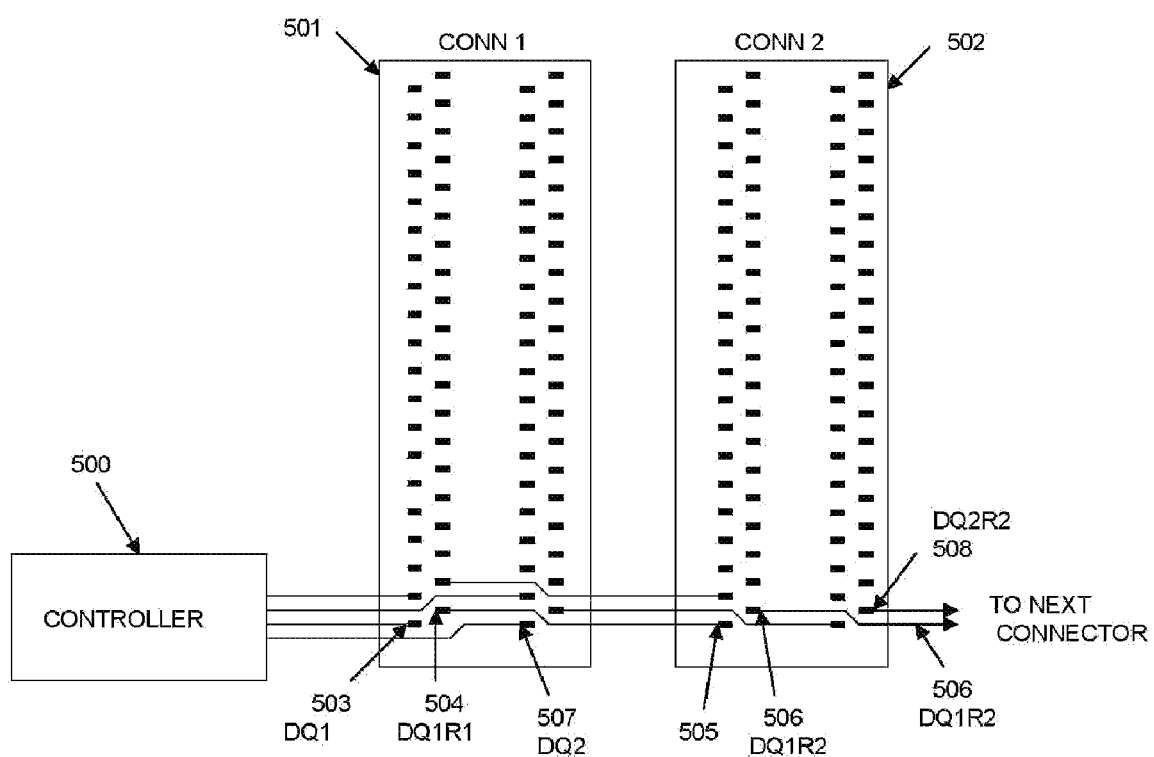
FIG. 5 depicts the footprint of two connectors of the present invention on the motherboard where each connector is attached and showing the wiring providing for of the propagation of a signal from one connector to the next.

Referring next to FIG. 5 a further explanation of the propagation of a signal from controller to the first DIMM and from first DIMM to the second DIMM and so on, may be understood. Representative footprints of the active connectors 501 and 502 on the motherboard appear in this drawing.

Still referring to this drawing, controller 500 interface provides all the signals required by the memory sub-system. DQ1 signal connects to tab 503 of the first connector 501. The re-driven output DQ1R1 appears on tab 504 of connector 501 and connects to tab 505 of the second connector 502. The re-driven output DQ1R2 on tab 506 from the active circuit of connector 502 is propagated to the next connector footprint, if there is one. The same principle applies to DQ2 507 and final re-driven output 508 DQ2R2.

Figure 6:
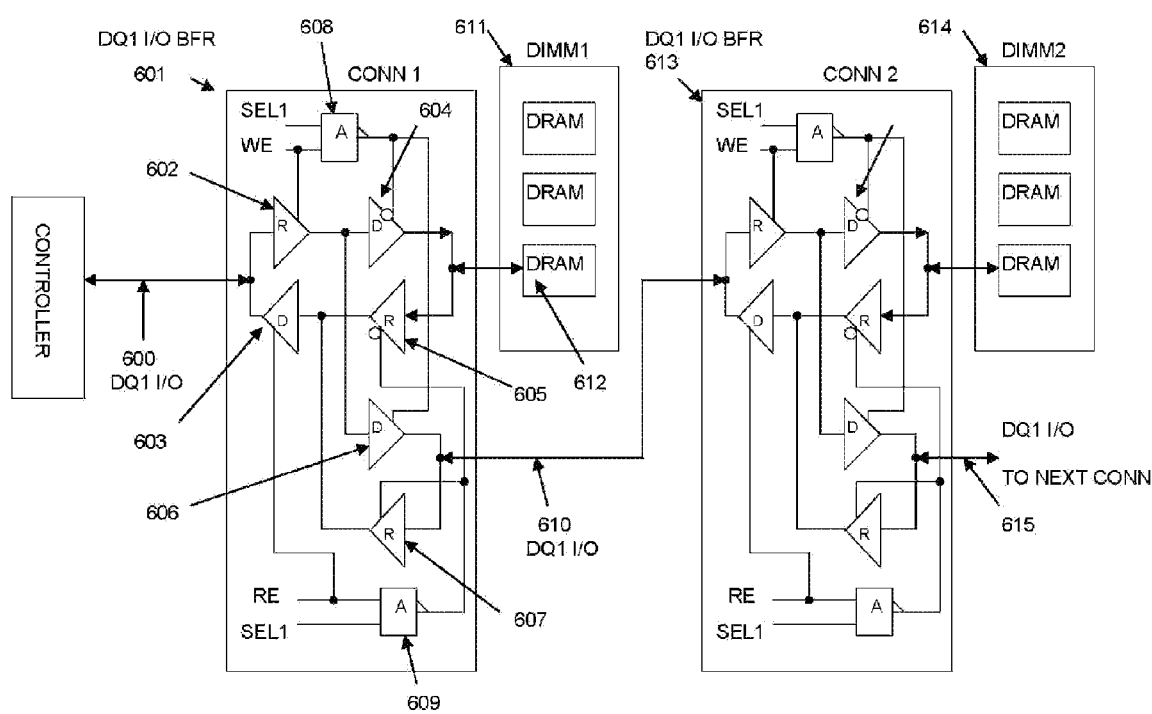
FIG. 6 depicts a block diagram of the logic implementation of active circuits for a single data bit signal of the present invention.

Referring next to FIG. 6 the active circuits on the connector that process the data signals are shown. It should be noted that the signals processed by the active circuits are classified as either data signals or control and address signals.

Along with the re-driving function, these must be such as to allow a selection of a direction of the bi-directional signals based on the function performed either WRITE or READ.

The circuits shown in this figure contain both receiver circuits and driver circuits. The receiver portion matches the characteristic impedance of the point-to-point connection trace on the motherboard. This receiver portion receives small amplitude signals and restores the amplitude to pass through to the re-driving circuit.

The driving circuit provides power to the signal in full amplitude to preserve signal quality and drive through to the next point-to-point receiver, and also match the characteristic impedance of the next point-to-point connection trace on the motherboard.

The combination allows high speed signal transmission since the signaling will be short distance in point-to-point format.

A DQ1 I/O signal 600 will be used for purposes of illustration. The active circuit 601 controlling DQ1 is shown in its simplest form. Other more advanced designs with additional functions such as memory and registers and control functions can be used without departing from the invention.

DQ1 I/O BFR 601 has two paths. For a WRITE function, assuming that the WRITE function is intended for DIMM1, the signal travels through receiver 602, driver 604 and connects to DRAM 612 of DIMM1 611. Drivers 603, 606 and receivers 605 and 607 are disabled to avoid conflict and conserve power. The directionality is controlled by enabled gate 608 and disabled gate 609.

For a READ function from DIMM1, receivers 602, 607 and drivers 604 and 606 are disabled. Receiver 605 and driver 603 are enabled to pass the signal from DRAM 612 to the controller.

For a WRITE operation to DIMM2, CONN 1 active circuits are enabled only in the pass through WRITE mode. Receiver 602 and driver 606 are enabled and drivers 603, 604 and receivers 605 and 607 are disabled.

For a READ operation on DIMM2, CONN 1 active circuits are enabled only in the pass through READ mode. Drivers 604, 606 and receivers 602 and 605 are disabled due to the fact that DIMM1 is not selected. The signal travels from DQ1 I/O line 610 through receiver 607 and driver 603 to the controller. DQ1 I/O BFR 613 is similar to 601 in function and selection based on the function performed.

For continuation to more connectors, signal will travel through DQ1 I/O 615.

What has been just described, and shown in FIG. 6, is a simplified logic design of active circuits which may be used on the connectors. A more advanced and higher performance design, in further embodiments, can include extensive buffering of data to Registers or built in memory either static or non-volatile.

The controlling of the direction on each connector can be done on each connector through a decoding function of the address, command and control lines and Clocks since all are going through active circuits on each connector.

Figure 7:
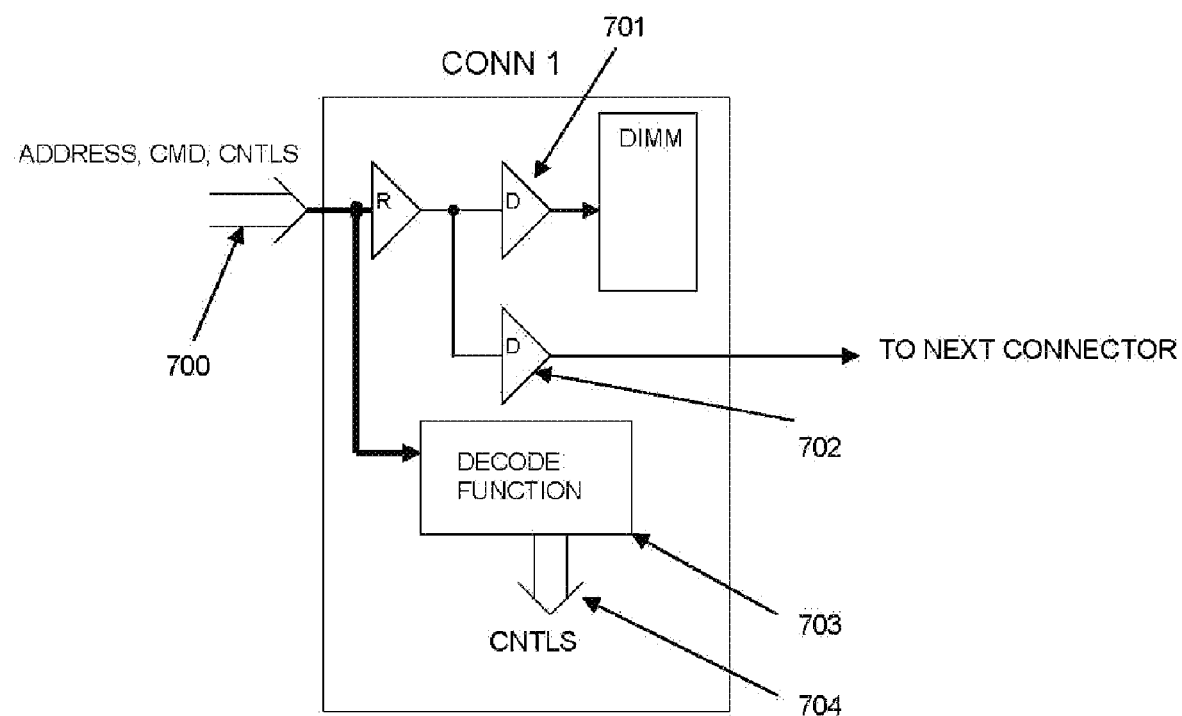
FIG. 7 depicts a block diagram of the logic implementation of active circuits for a single unidirectional address or command or control signal of the present invention.

Referring next to FIG. 7 a block diagram of the logic implementation of active circuits for a single unit address or command or control signal of the present invention may be seen. As previously stated, the logic of FIG. 7 does not describe the processing of data signals, but rather the addressing and command and control signals processed by the active connector.

All address, command and control lines 700 are re-driven through the active circuits of each connector. For the DIMM inserted in the connector, each signal is re-driven through driver 701 and applied to it. The same signal is re-driven through driver 702 and exits the connector to be connected to the next connector in line. Decode circuits 703 are used to decode the address, command and control lines to produce selection and directional signals 704 for the intended function for the active circuits on the same connector. The same arrangement of receiver and drivers is copied and applied to every unidirectional line in each connector.

Figure 8:
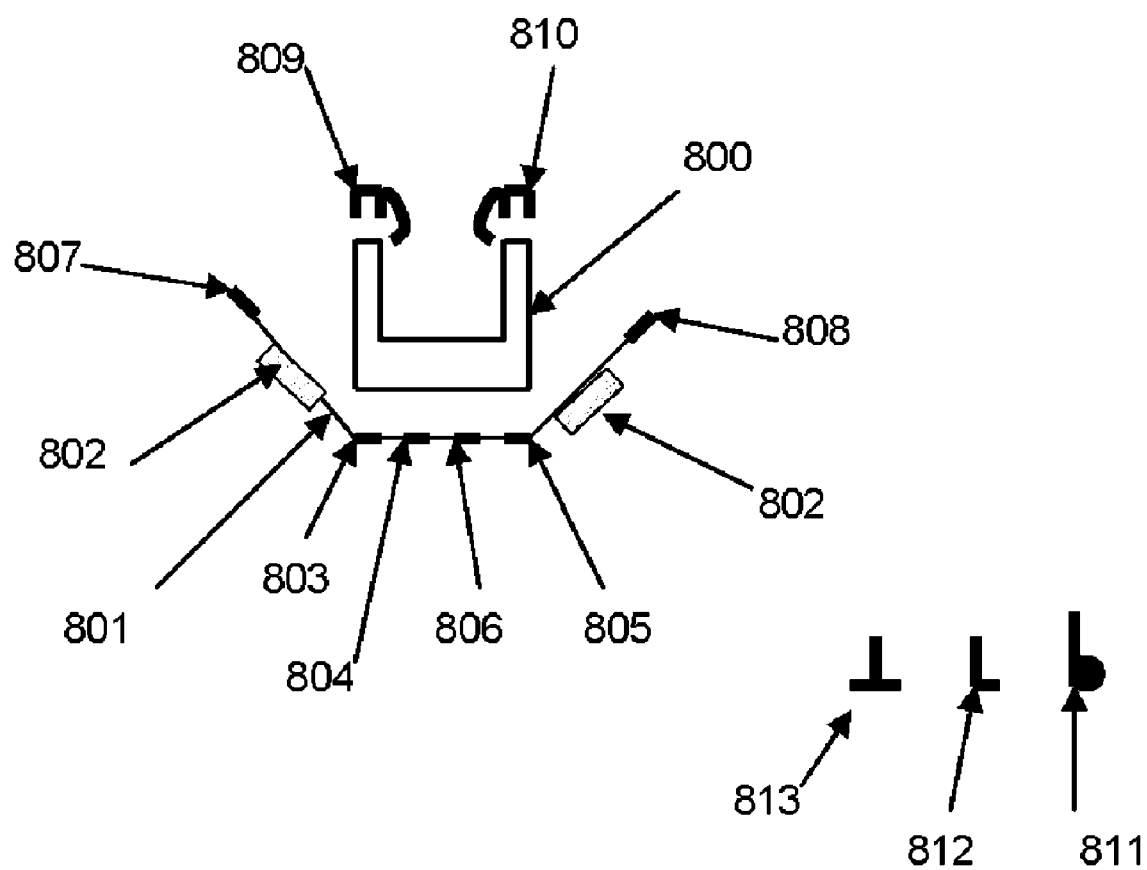
FIG. 8 depicts a cross sectional view of a connector of the present invention which includes Flex PCB printed circuits in its construction.

Referring next to FIG. 8 an alternative embodiment of the connector, utilizing an external Flex PCB for mounting of components, is shown. The Flex PCB also provides a means for printed wiring connecting the various components for communication with the inserted DIMM and with the mother board below the connector.

A connector body 800 is molded from plastic or other material in the form of a connector to provide rigidity and the required cavity to accept the DIMM edge connector.

A thin flexible sheet 801 with copper clad of a multi-layer substrate is etched to provide the motherboard connecting pads 803, 804, 805 and 806, pin connecting pads 807 and 808 for attaching pins 809 and 810 respectively, pads for soldering active circuits 802 and printed wires for interconnections.

The exterior surface of the body 800 is prepared with adhesive substance to accept the Flex PCB. The prepared Flex PCB is then wrapped around the connector and pressed against it to permanently adhere to it.

Pads 803, 804, 805 and 806 become the surface mounting contact points soldering the connector to the motherboard by use of solder balls or metal pins. Pins 809 and 810 are pressed around the connector body and the tabs 807 and 808 respectively and are soldered to said tabs for good electrical connection.

Another approach to creating surface mounting pins is to actually use pins such as 811, 812 or 813. Said pins are forced through the pads 803, 804, 805 and 806 and lodge themselves within the body of the connector. Then the external portion of the pin is soldered to the pad for good electrical connection.

In another embodiment of the invention, the active circuits 802 could be placed on the inside surface 801 of material facing the face of the connector body 800. In this case hollow packets are formed on the body 800 to hide the active circuits.

A shroud can be used to protect the components and the pins during reflow soldering, as in a previous embodiment.

In alternative embodiment of the invention the active circuits described in this invention could be applied directly on the motherboard as Chip on Board (COB) and use a conventional connector instead.

Figure 9:
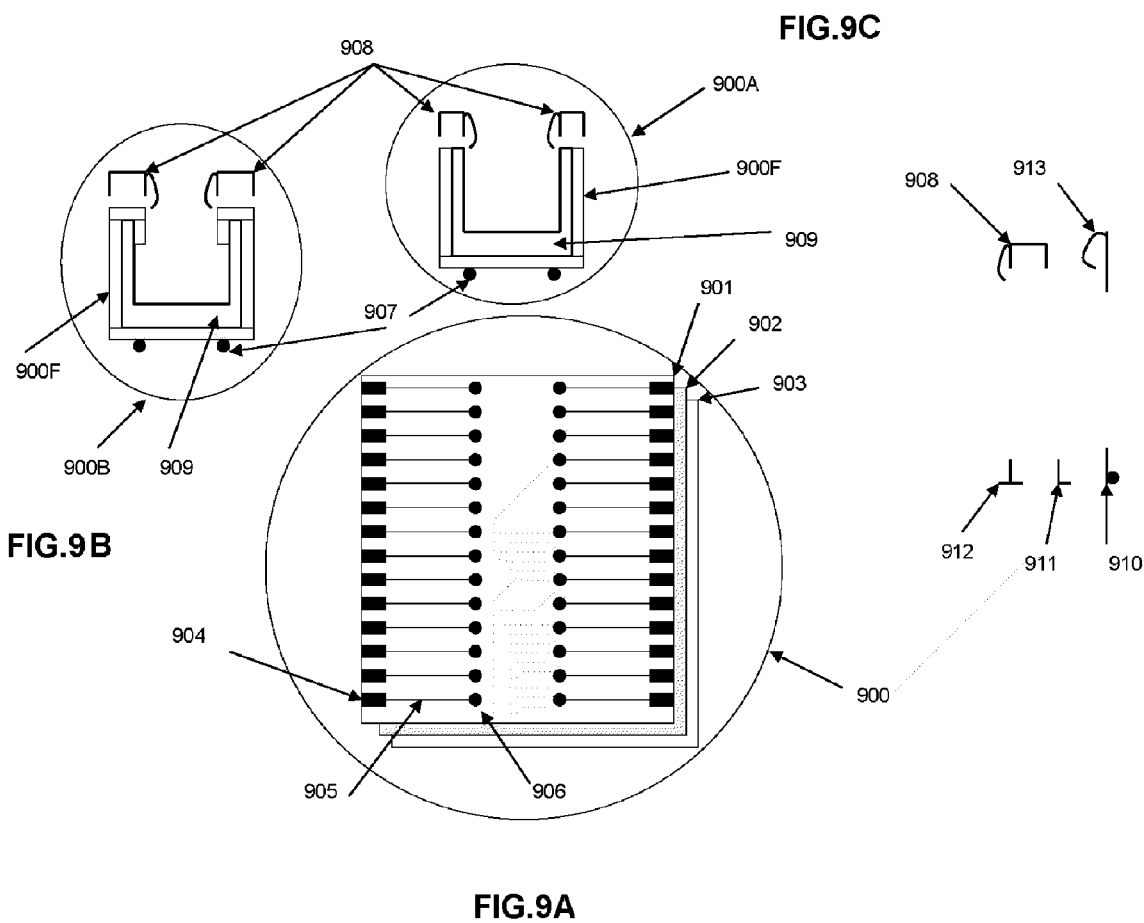
FIG. 9A depicts cross sectional views and a view of the multi-plane of the Flex PCB substrate which forms the outer surface of the connector of the present invention, in a second embodiment.
FIG. 9B depicts a cross section of the connector using the Flex PCB substrate of FIG. 9A
FIG. 9C depicts a cross section of the connector using the Flex PCB substrate of FIG. 9A in an alternative embodiment.

Referring next to FIG. 9A, depicting an alternative embodiment of the present invention, a view of the multi-plane of the flexible substrate which forms the outer surface of the connector of the present invention is shown. FIGS. 9B and 9C further show how this embodiment functions.

A high speed connector with controlled impedance and without active circuits is constructed as shown herein.

Item 900 is shown as a multi-layer substrate with copper clad surfaces. One layer is used for ground plane 902, one for VCC power plane 903 and one for signal interconnections 901. The signal plane 901 contains pads of different shape and size and printed wires. The printed wires 905 are used to connect corresponding pads. Wire 905 connects pad 906 to pad 904. All other pads are connected in a similar fashion. Pads that are connected to Ground and VCC Power planes on the motherboard are connected also through plated via holes to corresponding ground 902 and VCC Power 903 planes of item 900. The total thickness of item 900 is as thin as possible to allow for flexible bending around corners of item 909. Item 909 shown in a U shape is prefabricated by known methods of injection molding for plastic or other suitable material, or mechanically pre-cast or machined. It is constructed to appropriate dimensions so that a DIMM edge connector can be inserted into it. The finished item 900 is wrapped around the outside perimeter of item 909, shown as 900F, and attached to it with adhesive material permanently.

Solder balls 907 are affixed to pads 906. The solder balls are used to make connection to the corresponding pads of the motherboard that the connector is attached during the re-flow process.

On pads 904 which appear on top of the U shape sides of item 909F, pins 908 or 913 or any other suitable shape are attached and soldered for good electrical connection. The formed portion of pins 908 or 913 that protrude to the inside of the U shaped cavity is used to mate and make connection to the corresponding pads of the inserted DIMM edge connector. Since behind each wire 905 there is a reference plane, the impedance is fabricated to match the motherboard impedance. The path of wire 905 becomes a transmission line instead of a stub. Stubs present impedance discontinuity, with attendant signal degradation. Therefore, the impedance discontinuity of the signal path from the motherboard pad to the pin connection to the DIMM pad should be minimized.

Instead of item 900A, item 900B can be used without departing from the invention. The only difference is that item 900B has item 900 wrapped around the top edges of item 909 as shown.

Pins 908 can be substituted with pins 913 or any other suitable shape and material. Solder balls 907 can be substituted with pins such as 910, 911 or 912 or any other shape and material without diminishing the value of the invention.

It will be apparent that improvements and modifications may be made within the purview of the invention without departing from the scope of the invention defined in the appended claims.

I claim:

1. An active connector, comprising:
   a connector including a plurality of electrical connections, wherein the connector is configured to electrically connect a motherboard to a component board configured for insertion into the connector; and
   a re-driver chip electrically connected to at least two of the plurality of electrical connections for the connector, wherein the re-driver chip is configured to amplify signals transmitted between the motherboard and the component board when the component board is inserted into the connector, and wherein the re-driver chip is further configured to amplify an input signal received from one of the motherboard or the component board at a first electrical connection of the connector and to provide the amplified input signal to the other of the motherboard or the component board through a second electrical connection of the connector.

2. The active connector of claim 1, wherein the connector further comprises a connector base, and wherein the re-driver chip is mounted on a side of the connector base.

3. The active connector of claim 1, wherein the re-driver chip is further configured to condition the input signal to reduce degradation of quality of the input signal.

4. The active connector of claim 1, further comprising an addressing chip configured to process control signals to determine a direction of flow of signals through the re-driver chip.

5. The active connector of claim 4, further comprising a decode circuit configured to decode the control signals to produce directional signals used to determine the direction of flow of signals through the re-driver chip.

6. The active connector of claim 1, wherein the re-driver chip is mounted directly on the motherboard in a chip-on-board configuration.

7. The active connector of claim 1, wherein the re-driver chip comprises a receiver circuit configured to receive the input signal and increase an amplitude of the input signal for transmission to at least one of the component board or the motherboard.

8. The active connector of claim 7, wherein the receiver circuit is configured to match an impedance of a connection trace on the motherboard through which the input signal is received.

9. The active connector of claim 1, wherein the re-driver chip comprises a driver circuit configured to provide electrical power to amplify the input signal and to transmit the amplified input signal to the motherboard or the component board.

10. The active connector of claim 9, wherein the driver circuit is configured to match an impedance of a connection trace on the motherboard through which the input signal is transmitted.

11. The active connector of claim 1, wherein the connector further comprises a printed circuit board, and wherein the re-driver chip is mounted on the printed circuit board.

12. The active connector of claim 11, wherein the printed circuit board comprises a flexible printed circuit board.

13. The active connector of claim 11, wherein the motherboard is electrically connected to the printed circuit board on a first side of the printed circuit board and the component board is connected to the printed circuit board on a second side of the printed circuit board.

14. The active connector of claim 1, wherein the component board comprises a memory module.

15. The active connector of claim 1, wherein the re-driver circuit is further configured to drive signals to another re-driver circuit coupled to another connector.

16. An active connector, comprising:
a memory connector including a plurality of electrical connections, wherein the memory connector is configured to electrically connect a motherboard to a memory module configured for insertion into the memory connector; and
a re-driver chip mounted on the memory connector and electrically connected to at least two of the plurality of electrical connections for the memory connector, wherein the re-driver chip includes:
a receiver circuit configured to receive a signal from one of the motherboard or the memory module; and
a driver circuit configured to provide electrical power to amplify the signal and to drive the signal to the other of the motherboard or the memory module;
wherein at least one of the receiver circuit or the driver circuit is configured to match an impedance of a connection trace on the motherboard to which the at least one of the receiver circuit or the driver circuit is electrically connected.

17. The active connector of claim 16, wherein the driver circuit is further configured to condition the signals to reduce degradation of quality of the signal.

18. The active connector of claim 16, wherein the receiver circuit is further configured to match an impedance of a connection trace on the motherboard through which the signal is received.

19. The active connector of claim 16, wherein the driver circuit is further configured to match an impedance of a connection trace on the motherboard through which the signal is transmitted.

20. A motherboard, comprising:
a circuit board including a first electrical connection, wherein the first electrical connection has a characteristic impedance;
an active connector configured to electrically connect the circuit board to a memory module using the first electrical connection, wherein the memory module is configured for insertion into the active connector, wherein the active connector includes a re-driver chip configured to amplify an input signal received from one of the circuit board or the component board and to provide the amplified input signal to the other of the circuit board or the component board, and wherein the re-driver chip comprises a second electrical connection having the same characteristic impedance as the first electrical connection.

21. The motherboard of claim 20, wherein the active connector is one of a plurality of active connectors configured to electrically connect the circuit board to a plurality of memory modules, wherein each of the plurality of active connectors comprises a re-driver chip configured to provide electrical power to amplify signals and to drive the signals to at least one of the motherboard, one of the plurality of memory modules, or a re-driver chip of another active connector.

22. A method of transmitting signals between a motherboard and a memory module inserted into an active connector, wherein the active connector is electrically connected to the motherboard and the memory module, the method comprising:
receiving a signal from one of the motherboard or the memory module at the active connector, wherein the signal is received at a re-driver circuit configured to match an impedance of a connection trace on the motherboard to which the re-driver circuit is electrically connected; and
amplifying the signal and driving the signal to the other of the motherboard or the memory module using the active connector.

23. The method of claim 22, wherein the motherboard is electrically connected to a plurality of active connectors, wherein each of the plurality of active connectors comprises a re-driver circuit, and wherein the method further comprises:
receiving the signal from the motherboard at a first re-driver circuit of a first active connector;
amplifying the signal and driving the signal to a first memory module inserted into the first active connector when a destination of the signal is the first memory module; and
when the destination of the signal is another memory module inserted into another active connector, amplifying the signal and driving the signal to a second re-driver circuit of a second active connector.

24. The method of claim 22, further comprising conditioning the signal to reduce degradation of quality of the signal.

* * * * *

UNITED STATES PATENT AND TRADEMARK OFFICE
CERTIFICATE OF CORRECTION

PATENT NO. : 8,040,683 B2  
APPLICATION NO. : 12/425107  
DATED : October 18, 2011  
INVENTOR(S) : Karabatsos Page 1 of 1

It is certified that error appears in the above-identified patent and that said Letters Patent is hereby corrected as shown below:

Title page, item (57), under "Abstract", in Column 2, Line 5, delete "mother board" and insert -- motherboard --.

Title page, item (57), under "Abstract", in Column 2, Lines 9-10, delete "mother board," and insert -- motherboard, --.

Column 1, line 4, below Title, insert -- PROSECUTION HISTORY --.

Signed and Sealed this
Fifteenth Day of May, 2012

David J. Kappos
*Director of the United States Patent and Trademark Office*